(12) United States Patent
Pieters

(10) Patent No.: US 11,569,400 B2
(45) Date of Patent: Jan. 31, 2023

(54) CIRCUIT CONFIGURATION FOR POWER GENERATION COMPRISING SERIES-CONNECTED SOLAR CELLS HAVING BYPASS DIODES

(71) Applicant: Forschungszentrum Jülich GmbH, Jülich (DE)

(72) Inventor: Bart Elger Pieters, Jülich (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 17/415,083

(22) PCT Filed: Dec. 17, 2019

(86) PCT No.: PCT/EP2019/085481
§ 371 (c)(1),
(2) Date: Jun. 17, 2021

(87) PCT Pub. No.: WO2020/127142
PCT Pub. Date: Jun. 25, 2020

(65) Prior Publication Data
US 2022/0069147 A1    Mar. 3, 2022

(30) Foreign Application Priority Data

Dec. 20, 2018   (DE) .......................... 102018222591.5

(51) Int. Cl.
*H01L 31/0443* (2014.01)
*H01L 31/05* (2014.01)

(52) U.S. Cl.
CPC ...... *H01L 31/0443* (2014.12); *H01L 31/0504* (2013.01)

(58) Field of Classification Search
CPC .................. H01L 31/0443; H01L 31/0504
See application file for complete search history.

(56) References Cited

U.S. PATENT DOCUMENTS

| | | | |
|---|---|---|---|
| 6,274,804 B1 | 8/2001 | Psyk et al. | |
| 10,665,743 B2 * | 5/2020 | Dai | H01L 31/0443 |
| 2003/0000565 A1 | 1/2003 | Hayashi et al. | |
| 2008/0142071 A1 * | 6/2008 | Dorn | H05K 1/0293 |
| | | | 136/244 |
| 2010/0078057 A1 | 4/2010 | Karg et al. | |

(Continued)

FOREIGN PATENT DOCUMENTS

| | | |
|---|---|---|
| DE | 299 23 380 | 9/2000 |
| EP | 0 984 495 | 3/2000 |
| JP | S59 129478 | 7/1984 |

*Primary Examiner* — Golam Mowla
(74) *Attorney, Agent, or Firm* — Renner, Otto, Boisselle & Sklar, LLP

(57) ABSTRACT

The invention relates to a solar module which is technically easy to manufacture and has a plurality of solar cells arranged one behind the other and electrically connected in series, wherein a bypass diode for electrical bypassing is electrically connected in parallel with each solar cell, wherein the bypass diodes are arranged one behind the other, wherein each solar cell and each bypass diode comprises a photovoltaically active layer, a lower electrically conductive layer and an upper electrically conductive layer both of which adjoin the photovoltaically active layer, characterized in that each bypass diode is arranged between solar cells.

18 Claims, 4 Drawing Sheets

(56) References Cited

U.S. PATENT DOCUMENTS

Figure 1:
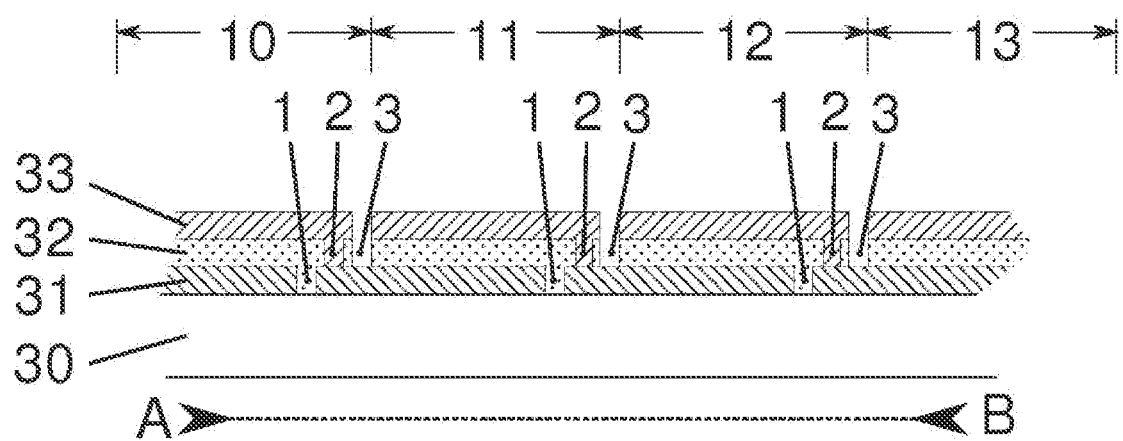

| | | | |
|---|---|---|---|
| 2012/0291835 A1 | 11/2012 | Lu et al. | |
| 2013/0104954 A1 | 5/2013 | Zhou et al. | |
| 2015/0144173 A1* | 5/2015 | Hoang | H01L 31/042 136/244 |
| 2018/0062011 A1* | 3/2018 | Crist | H01L 31/044 |

* cited by examiner

CIRCUIT CONFIGURATION FOR POWER GENERATION COMPRISING SERIES-CONNECTED SOLAR CELLS HAVING BYPASS DIODES

This application is a national phase of International Application No. PCT/EP2019/085481, filed Dec. 17, 2019, which claims priority to DE Application No. 102018222591.5, filed on Dec. 20, 2018, the entire disclosures of which are hereby incorporated by reference.

The invention relates to a solar module for power generation with series-connected solar cells having bypass diodes.

A solar cell, also called a photovoltaic cell, is an electronic component by which radiant energy, in particular light, can be converted into electrical energy. A solar cell comprises a photovoltaically active material. In the photovoltaically active material, free charge carriers can be generated by an electromagnetic radiation. Two electrodes adjoin opposite sides of the photovoltaically active material. The photovoltaically active material is then located between the two electrodes.

The photovoltaically active material may be a pn semiconductor. The generated free charge carriers are led out of the photovoltaically active material for example through an electrical field, such as an internal electric field of a pn semiconductor. The electrical current generated in this way can be supplied to an electrical consumer via the adjoining electrodes.

A pn semiconductor is a semiconductor with two regions which are oppositely doped. One region is negatively doped and an adjoining region is positively doped. The result is a pn junction with a junction layer (barrier layer) which, when an external voltage is applied, allows current to flow in one direction only, i.e. it allows electric current to pass in one direction and blocks the current flow in the other direction. A pn semiconductor located between two electrodes is thus a diode which can generate current by irradiation with an electromagnetic wave, i.e. it is operated as a solar cell. The then generated current flows in reverse direction (blocking direction) of the diode.

It is known to connect a plurality of photovoltaic cells electrically in series with each other in order to be able to generate higher electrical voltages. The same current then flows through all the solar cells connected in series.

A solar module is a component that comprises a plurality of photovoltaic cells that are electrically connected to each other. The photovoltaic cells of a solar module may be located on a common substrate. A solar module may comprise a frame and/or one or more protective layers for protection. A protective layer protects the photovoltaic cells from harmful external influences. A protective layer may consist of glass or plastic.

If, in a solar module with solar cells connected in series, a single solar cell is illuminated to a lesser extent than the adjacent solar cells or not at all, the other solar cells continue to supply current. At the shaded solar cell, the present electrical voltage then increases. If the voltage of the functional and irradiated solar cells connected in series exceeds the reverse voltage of the non-irradiated solar cell, this can even lead to the destruction of the latter. Since the other solar cells continue to supply current, overheating can occur at this point, which can lead to a fire. This effect is also known as a "hot spot". The same problem occurs when a single solar cell is not sufficiently functional for other reasons.

To avoid such problems, diodes can be installed in parallel to the solar cells. Such diodes are called bypass diodes and are known from the publication US 2003/0000565 A1 Bypass diodes electrically bypass shaded solar cells or solar cells that are not sufficiently functional for other reasons.

A solar module with solar cells connected in series is known from DE 299 23 380 U1. The solar cells are arranged one behind the other on a common substrate. In parallel and adjacent thereto, there are diodes connected in series and arranged one behind the other on the same substrate. Both the series-connected diodes and the solar cells consist of a front-side and a rear-side electrode layer and a photovoltaically active layer arranged therebetween.

It is the task of the invention to be able to manufacture a reliably functioning solar module in a technically easy manner.

This task is solved by a solar module with the features of claim 1 as well as by a method with the features of the additional claim. Advantageous embodiments result from the dependent claims.

The solar module comprises a first plurality of solar cells arranged one behind the other and electrically connected in series. A bypass diode for electrical bypassing is electrically connected in parallel with each solar cell. The bypass diodes are arranged one behind the other. Each solar cell and each bypass diode comprises a photovoltaically active layer, a lower electrically conductive layer and an upper electrically conductive layer. Each lower electrically conductive layer and the upper electrically conductive layer above adjoin a photovoltaically active layer therebetween. Each bypass diode is arranged between solar cells. Thus, there may be a second plurality of solar cells arranged one behind the other and electrically connected in series. A solar cell from the first plurality is then electrically connected in parallel with a solar cell from the second plurality.

One behind the other means a spatial arrangement. The solar cells and/or the bypass diodes form a line. Usually the solar cells arranged one behind the other and/or the bypass diodes arranged one behind the other are arranged along a straight line. However, a curved course is also possible. In principle, the solar cells arranged one behind the other and/or the bypass diodes arranged one behind the other are located on a common substrate.

"Each bypass diode is located between solar cells" means that on two opposite sides of each bypass diode regions adjoin which can and should generate current by irradiation with an electromagnetic wave. The regions adjoining opposite sides of a bypass diode are electrically connected in parallel with the bypass diode therebetween. A first and a second plurality of solar cells are thus possible. The solar cells of the first plurality are electrically connected with each other in series, so as to provide higher electrical voltages compared to the electrical voltage that a single solar cell may provide. For the same reason, the solar cells of the second plurality are also electrically connected with each other in series. The first and second plurality of solar cells can be spatially run parallel to each other. Each bypass diode serves to electrically bypass the solar cells adjoining it laterally. Bypass diodes spatially arranged one behind the other are then located between the first plurality of solar cells and the second plurality of solar cells.

"Photovoltaically active layer" means that the layer consists of a photovoltaically active material.

This structure makes it possible to manufacture a solar module in a technically easy manner. Suitable structuring for this is achieved by providing appropriate trenches during manufacture. Trenches may be filled. For example, there may be trenches filled with an electrical conductor to connect electrically conducting layers. There may be trenches that are filled with a material to facilitate fabrication. There may be trenches filled with a semiconductor material or an electrically insulating material to electrically separate electrically conducting layers from each other.

A first bypass diode may be separated from an adjoining second bypass diode by two trenches for a particularly easy manufacturing. An electrical conductor may run between the two trenches, connecting upper electrically conductive layers of solar cells in an electrically conducting manner, which laterally adjoin the first bypass diode. An electrical conductor may run between the two trenches which connects lower electrically conductive layers of solar cells, which laterally adjoin the second bypass diode, in an electrically conducting manner with each other.

The electrical conductor may be formed from an upper electrically conductive layer. The electrical conductor may be formed from a lower electrically conductive layer. The electrical conductor may be located between two photovoltaically active layers.

The two trenches separating a first bypass diode from an adjoining second bypass diode by two trenches may be filled with air or with another electrically insulating material.

The lower electrically conductive layers are preferably located on an electrically non-conductive layer to simplify fabrication. The electrically non-conductive layer may be a self-supporting layer, i.e. a substrate. The electrically non-conductive layer may be applied on a substrate. The electrically non-conductive layer may be pliable. The electrically non-conductive layer may be rigid.

The upper electrically conductive layer of a first solar cell is preferably electrically conductively connected to the lower electrically conductive layer of an adjoining second solar cell by an electrical conductor in order to electrically connect the two solar cells in series. Both solar cells then belong either to the first plurality of solar cells or to the second plurality of solar cells.

The electrical conductor electrically connecting the upper electrically conductive layer of the first solar cell to the lower electrically conductive layer of an adjoining second solar cell preferably separates the photovoltaically active layer of the first solar cell from the photovoltaically active layer of the second solar cell. What is meant here is a spatial separation. Such a spatial separation is present if the photovoltaically active layer of the first solar cell is completely or at least predominantly located on one side of the electrical conductor and the photovoltaically active layer of the second solar cell is completely or at least predominantly located on the other side of the electrical conductor. The electrical conductor is then located in a trench which runs between the two photovoltaically active layers in the aforementioned sense. In addition, there may be another trench which runs between the two photovoltaically active layers in the aforementioned sense. The further trench may, for example, be filled with an electrically insulating material. The trench, which is filled with electrically conductive material to form said electrical conductor, may be arranged spatially adjacent to the trench, which may be filled with an electrically insulating material.

The lower electrically conductive layer of a first solar cell is separated from the lower electrically conductive layer of an adjoining second solar cell preferably by a first trench. The upper electrically conductive layer of the first solar cell is separated from the upper electrically conductive layer of the adjoining second solar cell by a second trench. The first trench is to electrically separate two lower electrically conductive layers of two adjacent solar cells. The first trench may be filled with, for example, a semiconductor material or an electrical insulator to achieve the electrical separation. The first trench need not be filled to achieve electrical separation. The first trench may be filled with material of which the photovoltaically active layer adjoining it consists, in order to be able to manufacture in an improved manner particularly easily.

The second trench is to electrically separate two upper electrically conductive layers of two adjacent solar cells. The second trench may be filled with an electrical insulator or a semiconductor to achieve this. The bottom of the second trench may be formed by a lower electrically conductive layer. The second trench then separates the photovoltaically active layer of a first solar cell from the photovoltaically active layer of a second solar cell in the aforementioned sense. The second trench is then located in particular in the vicinity of said electrical conductor connecting two adjacent solar cells in series with each other.

A lower electrically conductive layer of a bypass diode may be separated from adjacent lower electrically conductive layers of solar cells connected electrically in parallel by trenches to electrically separate said lower electrically conductive layers from each other. The trenches may be filled with, for example, a semiconductor material or an electrical insulator to achieve the electrical separation. The trenches need not be filled to achieve electrical separation. The trenches may be filled with material of which the adjoining photovoltaically active layer consists in order to be able to manufacture particularly easily. The trenches may pass through all layers, i.e. through the upper and lower electrically conductive layers and thus also through the photovoltaically active layers.

A trench separating the lower electrically conductive layer of a bypass diode from an adjacent electrically conductive layer of a solar cell electrically connected in parallel may be filled with the material of which the adjoining photovoltaically active layer consists. This embodiment facilitates fabrication in a further improved manner.

The upper electrically conductive layer of a bypass diode may be separated from adjacent upper electrically conductive layers of solar cells electrically connected in parallel by trenches to facilitate fabrication in a further improved manner.

The bottom of a trench separating the upper electrically conductive layer of a bypass diode from an adjacent upper electrically conductive layer of a solar cell electrically connected in parallel may be formed by a lower electrically conductive layer to further facilitate fabrication in an improved manner.

The upper electrically conductive layer of a bypass diode may be electrically conductively connected to an adjacent lower electrically conductive layer of a first solar cell electrically connected in parallel by an electrical conductor. The lower electrically conductive layer of the bypass diode may be electrically conductively connected to an adjacent upper electrically conductive layer of second solar cell electrically connected in parallel by an electrical conductor. Manufacturing advantages can thus be achieved in a further improved manner.

An electrical conductor electrically connecting an electrically conductive layer of a bypass diode to an adjacent electrically conductive layer of a solar cell electrically connected in parallel may separate a photovoltaically active layer of the bypass diode from the photovoltaically active layer of the solar cell to achieve manufacturing advantages.

A first bypass diode may be separated from an adjoining second bypass diode by at least one trench, which can be manufactured technically easily.

A first bypass diode may be separated from an adjoining second bypass diode by two trenches. An electrical conductor may run between the two trenches, which electrically conductively connects upper electrically conductive layers of solar cells laterally adjoining the first bypass diode with each other, and which electrically conductively connects lower electrically conductive layers of solar cells laterally adjoining the second bypass diode with each other. A technically easy manufacturing is thus possible in a further improved manner.

One or more trenches separating a first bypass diode from an adjoining second bypass diode can pass through all layers of both bypass diodes. Such a trench then extends from the top side of the upper electrically conductive layer to the underside of the lower electrically conductive layer of the bypass diode. This may also be manufactured technically easily.

Photovoltaically active layers can consist of a pn semiconductor.

The solar cells and the bypass diodes are preferably arranged in one plane. In particular, the lower electrically conductive layers of the solar cells and the bypass diodes are of the same thickness and lie in the same plane. In particular, the upper electrically conductive layers of the solar cells and the bypass diodes are of the same thickness and lie in the same plane. In particular, the photovoltaically active layers of the solar cells and the bypass diodes are of the same thickness and lie in the same plane.

Preferably, the bypass diodes are shaded to minimize electrical power losses. If bypass diodes are shaded, no electromagnetic radiation, in particular no light, may impinge on the bypass diodes in such a way that an electric current can be generated by the bypass diodes. The shading may be achieved in a technically easy way by a correspondingly opaque varnish. The shading may be achieved in a technically easy way by correspondingly opaque one or more layers.

A top side of each bypass diode is preferably smaller than a top side of each solar cell to allow high electrical powers. In particular, the top side of each solar cell is at least twice as large as the top side of each bypass diode. By top side is meant a surface seen in top view of the solar module.

With the solar module according to the invention it is possible to provide an industrially easy-to-manufacture and efficient solar module having bypass diodes. The invention is based on the recognition that, in the case of solar modules having bypass diodes known from the prior art, a technically complex structuring is often required for the integration of the bypass diodes into the solar module.

The invention enables rectilinear structuring and interconnections, which facilitates production. Advantageously, angled structuring trenches may be dispensed with.

According to the invention, a solar module with solar cells connected in series is provided, in which each solar cell of the solar module is connected in parallel with at least one bypass diode, which may bypass the generated electric current around this solar cell in the event of complete or partial shading or a reduction in the functionality of this solar cell.

The solar module may have a superstrate structure as well as a substrate structure.

The superstrate structures comprise a substrate, a first electrode layer deposited thereon (front-side electrode layer), to which the photovoltaically active layer is applied, and the subsequent second electrode layer (back-side electrode layer). The electrically conductive layers form the electrode layers. In the case of the superstrate structure, the substrate and the front-side electrode layer are transparent so that radiation may penetrate through this sequence of layers.

In the case of the substrate structure, the coating sequence is reversed: the back-side electrode layer, which in this case is transparent, is applied to the substrate first, and subsequently the photovoltaically active layer and finally the front electrode layer are applied. The irradiation then first takes place through the transparent rear-side electrode layer onto the photovoltaically active layer.

All substrates or superstrates commonly used as such in solar cell technology, in particular CIGS (copper indium gallium diselenide) thin film solar cell technology as well as in CdTe (cadmium telluride) thin film solar cell technology, can be freely selected as substrates, such as e.g. glass/molybdenum as substrate for GIGS or e.g. glass/TCO as superstrate for CdTe.

The aforementioned substrates and superstrates are common in thin-film silicon solar cells, Currently, the relevant thin film technologies are CdTe and GIGS, wherein CdTe is typically applied on glass/TCO superstrate and GIGS on glass/molybdenum substrate.

A substrate may comprise functional layers for improved light scattering or for improved growth of the contact layer on the carrier.

For the first electrically conductive layer, material such as Mo or Ag (for substrate structure) or ZnO, $SnO_2$ or ITO (for superstrate structure) may be selected. On such a layer structure of substrate and first electrically conductive layers, the photovoltaically active layers can be subsequently applied on the strip-shaped first electrically conductive layers, and/or above trenches.

The solar module according to the invention comprises a number of solar cells arranged one behind the other, electrically connected in series, having a layer structure comprising a front-side and a back-side electrode layer and a photovoltaically active layer arranged therebetween, as well as a number of bypass diodes connected in parallel with the respective solar cell, which have a layer structure like the solar cells, wherein adjacent bypass diodes are not electrically conductively contacted with one another and each bypass diode is connected in parallel with a solar cell on the right and left, respectively.

In the following, the invention will be explained in more detail on the basis of exemplary embodiments and the attached Figures, without this leading to a restriction of the invention.

Figure 2A:
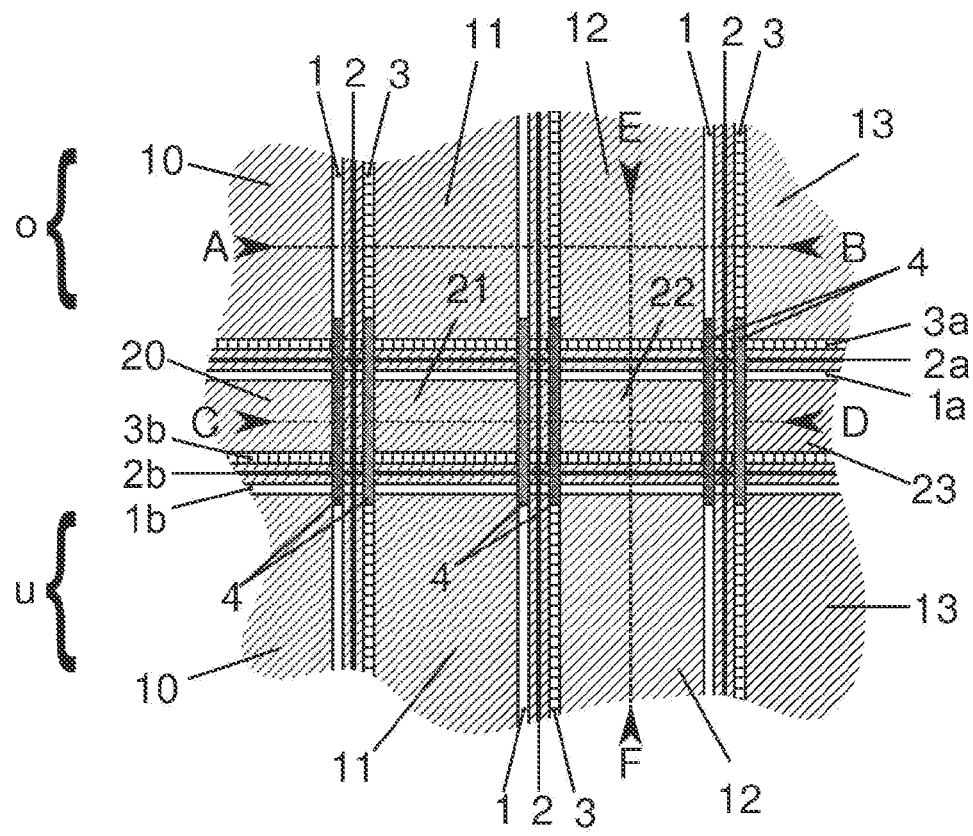

In the following, exemplary embodiments of the invention are explained in more detail on the basis of the figures. They show schematically:

FIG. 1: through solar cells 10, 11, 12 and 13 of a solar module FIG. 2*a*: Top view of a solar module FIG. 2*b*: Electrical equivalent circuit diagram of the solar module from FIG. 2*a*

Figure 3:
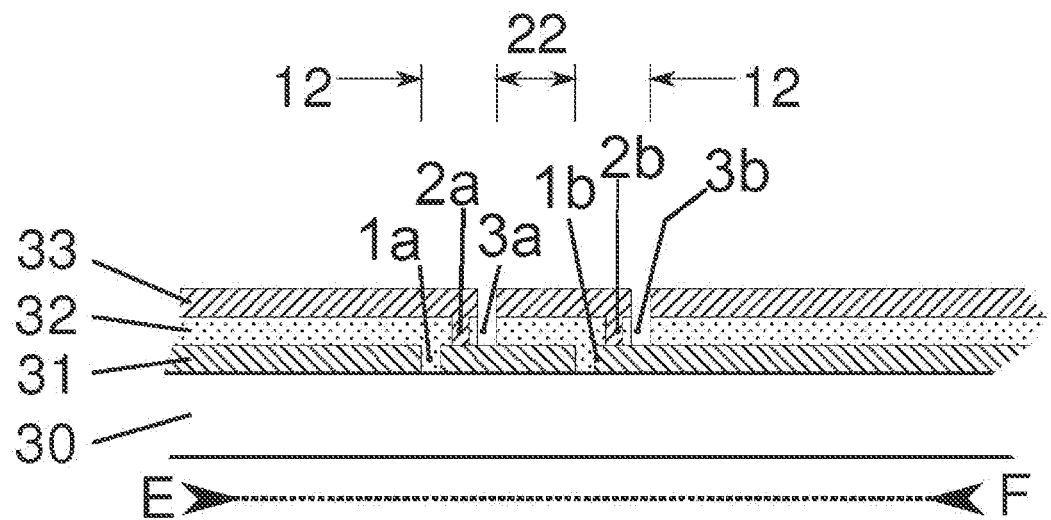

FIG. 3: Sectional view through solar module from FIG. 2*a*

Figure 4:
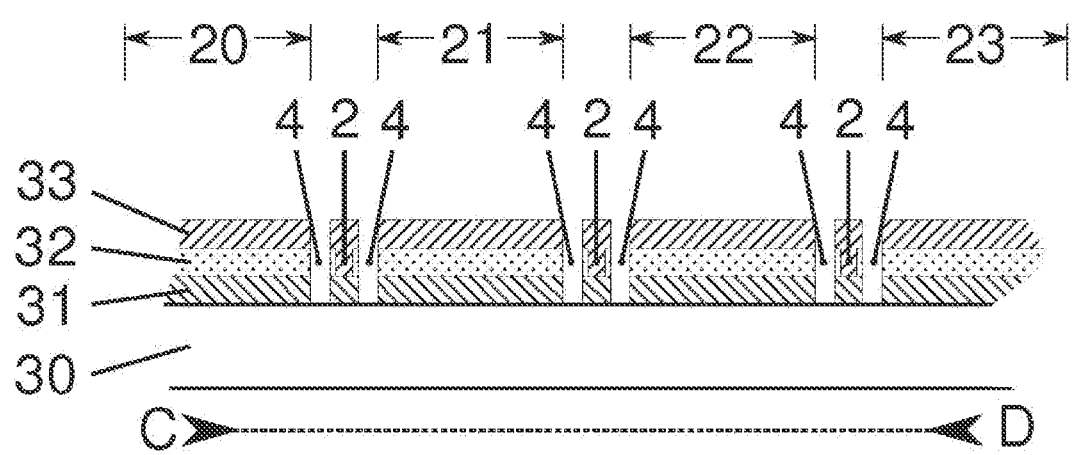

FIG. 4: Sectional view through solar module from FIG. 2*a*

Figure 5:
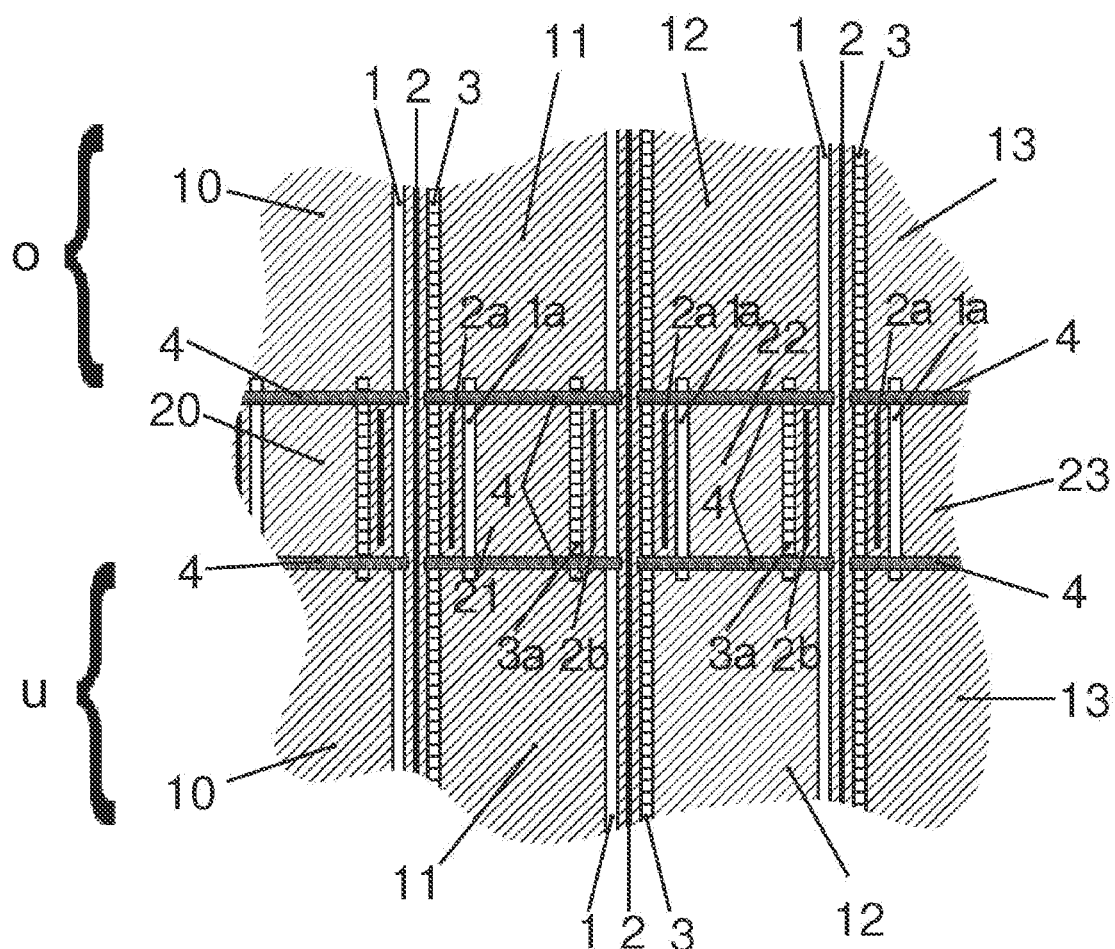

FIG. 5: Top view of a solar module according to a second exemplary embodiment FIG. 1 shows a section through solar cells 10, 11, 12 and 13 of a solar module.

First, electrically conductive layers 31 have been manufactured on an electrically non-conductive substrate 30 such that the layers 31 are applied one behind the other on the substrate 30 as shown in FIG. 1 and are electrically separated from each other by trenches 1. The trenches 1 may be filled with a photovoltaically active material, but this is not necessary for the solar module to function. The layers 31 may have been applied on the substrate 30 by a printing process. However, a continuous electrically conductive layer may also have been initially applied to the substrate 30, which after its application was divided by trenches 1.

In a next step, a photovoltaically active material has been applied and processed, if necessary, in such a way that layers 32 arranged one behind the other have been created, which are separated from each other by trenches 2 filled with electrically conductive material. The photovoltaically active material may have entered the trenches 1 due to the application as a result of the manufacturing. However, this is not necessary.

The photovoltaically active material may initially have been applied as a continuous layer, into which trenches to be filled with electrically conductive material were introduced by removing material after application. Alternatively, the layers 32 may have been applied in a single step by a printing process without the necessity to subsequently remove material in order to create trenches to be filled with electrically conductive material and, if necessary, also further trenches 3.

In a next step, electrically conductive material was applied to the layers 32 in layers and, if necessary, processed such that they electrically contact the electrically conductive layers 31 through the trenches 2 and are present as layers 33, which are electrically separated from each other by trenches 3. The trenches 3 may have been manufactured by removing material. The trenches 3 may adjoin the lowermost electrically conductive layers 31. However, the trenches 3 may also have been created by printing.

In this way, solar cells 10, 11, 12, 13 of a solar module are produced which are arranged one behind the other and which are electrically connected in series. Each solar cell comprises a lower layer-shaped electrode 31 and an upper layer-shaped electrode 32. The two electrodes 31 and 32 are separated from each other by a photovoltaically active semiconductor layer 32. The solar cells 10, 11, 12 and 13 are arranged one behind the other and are electrically connected in series through the trenches 2 filled with electrically conductive material.

In FIG. 2a a top view of a solar module with such solar cells 10, 11, 12, 13 is shown. The section from FIG. 1 runs along the section line AB shown in FIG. 2a.

Now, in order to obtain a solar module according to the invention, bypass diodes 20, 21, 22, 23 connected in parallel for the solar cells 10, 11, 12, 13 are manufactured as shown in FIG. 2a. In order to manufacture the bypass diodes 20, 21, 22, 23 connected in parallel to the solar cells 10, 11, 12, 13, the trenches 1, 2, 3 are not only manufactured in a direction transverse to the solar cells 10, 11, 12, 13, but also in pairs parallel to the solar cells 10, 11, 12, 13. The reference signs 1a, 2a, 3a as well as 1b, 2b, 3b in FIG. 2a refer to the transversely manufactured trenches. These transversely manufactured trenches 1a, 2a, 3a and 1b, 2b, 3b can be manufactured in the same way as described by reference to FIG. 1. The trenches 1a, 1b can be filled with a photovoltaically active material like the trenches 1, but this is not necessary for the solar module to function. Trenches 2a and 2b, like trenches 2, are filled with electrically conductive material. The trenches 3a, 3b may adjoin the lowermost electrically conductive layers 31.

FIG. 3 illustrates this in a sectional view along the section line EF from FIG. 2a.

In addition, trenches 4 are produced as they are shown in FIG. 4 by means of a sectional view along the section line CD of FIG. 2a. The trenches 4 extend to the substrate 30. The trenches 4 are produced in particular by a subsequent removal of material. However, it is also possible to produce these trenches 4 directly by printing.

Through these additional trenches, solar cells are not only connected in series, but additionally also connected in parallel. This is illustrated in FIG. 2a by the curved brackets marked with "o" for the upper solar cells and "u" for the lower solar cells. The solar cells marked with "o" form a first plurality of solar cells arranged one behind the other, which are electrically connected in series. The solar cells marked with "u" form a second plurality of solar cells arranged one behind the other, which are electrically connected in series. A bypass diode is located between two solar cells electrically connected in parallel.

FIG. 2a shows that each top side of each solar cell 10, 11, 12, 13 is larger than each top side of each bypass diode. FIG. 2a illustrates that technically easy to manufacture rectilinear structures are sufficient to manufacture the solar module.

Figure 2B:
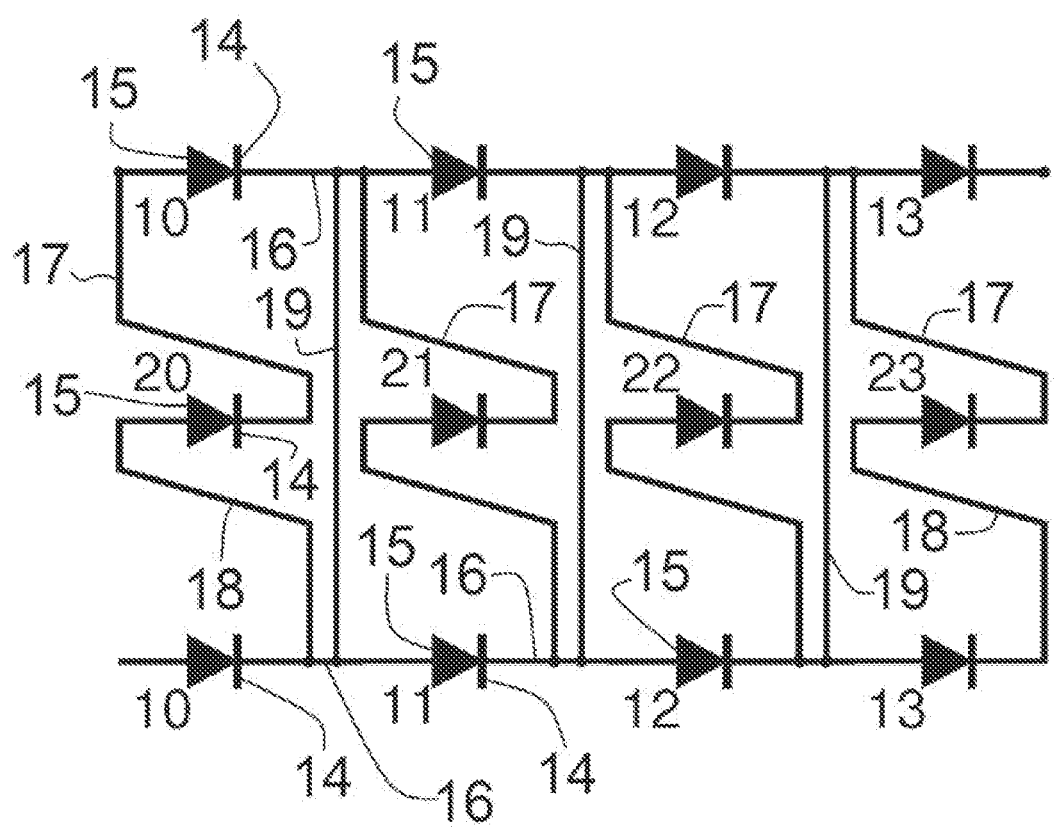

FIG. 2b shows an electrical equivalent circuit of the solar module of FIG. 2a, Diodes 10, 11, 12, 13 are electrically connected in series. For this purpose, the anode side 14 of a solar cell 10 shown on the left at the top is connected to the cathode side 15 of a spatially following, adjoining solar cell 11 via an electrical conductor 16. The following solar cell 11 is accordingly electrically conductively connected to the following solar cell 12. The solar cell 12 is accordingly electrically conductively connected to the following solar cell 13. This applies to both the upper and the lower plurality of solar cells 10, 11, 12, 13, The solar cells 10, 11, 12, 13 are constructed like the diodes 20, 21, 22, 23.

If a diode is operated as a solar cell, which is then irradiated with an electromagnetic radiation, in particular light, an electric current is generated, which the diode does not transmit in the absence of illumination. If the solar cells 10, 11 and 13 generate a current and the solar cells 12 connected in parallel does not, the generated current flows from right to left. The current coming from the upper solar cell 13 connected in parallel via conductor 16 passes through the bypass diode 22 via electrical conductors 17 and 18, bypassing the two solar cells 12 connected in parallel to it. The current coming from the lower solar cell 13 via the electrical conductor 16 bypasses the two solar cells 22 via the electrical conductors 19, 17, 18 and the bypass diode 22.

The embodiment shown in FIG. 5 shows that the circuitry shown in FIG. 2b can also be achieved by differently arranged rectilinear trenches and that the production of angled trenches can be omitted. The solar cells 10, 11, 12, 13 are interconnected as in the case of FIG. 2a by rectilinear trenches 1, 2, 3. The trenches 1 may again be filled as described with the semiconductor material of which the photovoltaically active layers 32 consist. The trenches 2 are filled with electrically conducting material as previously described. The trenches 3 may be filled with an electrically non-conductive material as described before.

By means of trenches 4 running transversely to the trenches 1, 2, 3, the upper and lower solar cells 10, 11, 12, 13 are suitably separated from the bypass diodes 20, 21, 22, 23. Trenches 1a, 2a, 3a, 2b running parallel to this, which may be or are filled with other material as already described, complete the solar module in order to arrive at an equivalent circuit diagram according to FIG. 2b.

Again, rectilinear to structures are sufficient to create a solar module according to the invention. Creating a trench that is angled is again not required.

FIGS. 2a and 5 show embodiments with straight-running structures. Such courses are usually preferred for manufacturing reasons. However, curved runs are also possible, which may be of interest if installation situations require curved runs. Parallel courses of structures, such as those shown in FIGS. 2a and 5, are also not necessary. Instead, for example, rectangular geometries can be realized in order to realize the present invention.

REFERENCE SIGNS

1: Trench 1 according to a structuring step P1
2: Trench 2 according to a structuring step P2
3: Trench 3 according to a structuring step P3
4: Trench 4 according to a structuring step P4
1a: Trench 1a according to a structuring step P1a
2a: Trench 2a according to a structuring step P2a
3a: Trench 3a according to a structuring step P3a
1b: Trench 1b according to a structuring step P1b
2b: Trench 2b according to a structuring step P2b
3b: Trench 3b according to a structuring step P3b
10: Solar cell
11: Solar cell
12: Solar cell
13: Solar cell
14: Anode side
15: Cathode side
16: Electrical conductor
17: Electrical conductor
18: Electrical conductor
19: Electrical conductor
20: Bypass diode
21: Bypass diode
22: Bypass diode
23: Bypass diode
30: Substrate layer
31: Electrode layer
32: Semiconductor layer
33: Electrode layer

The invention claimed is:

1. A solar module having solar cells, the solar cells including a plurality of solar cells arranged one behind the other and electrically connected in series, wherein a bypass diode for electrical bypassing is electrically connected in parallel with each solar cell, wherein the bypass diodes are arranged one behind the other, wherein each solar cell and each bypass diode comprises a photovoltaically active layer, a lower electrically conductive layer, and an upper electrically conductive layer, both of which adjoin the photovoltaically active layer, wherein the solar cells including solar cells electrically connected in parallel adjoining two opposite sides of each bypass diode, with the solar cells adjacent to the opposite sides of a bypass diode, electrically connected in parallel with the bypass diode therebetween, and wherein a first bypass diode is electrically separated from an adjoining second bypass diode by two trenches and an electrical conductor that runs between the trenches, which electrically conductively interconnects the upper electrically conductive layers of the plurality of solar cells which laterally adjoin the first bypass diode, and/or which electrically conductively interconnects the lower electrically conductive layers of the plurality of solar cells which laterally adjoin the second bypass diode.

2. The solar module according to claim 1, wherein the lower electrically conductive layers of both the solar cells and the bypass diodes are located on an electrically non-conductive layer.

3. The solar module according to claim 1, wherein the upper electrically conductive layer of a first solar cell is electrically conductively connected to the lower electrically conductive layer of an adjoining second solar cell by the electrical conductor.

4. The solar module according to claim 3, wherein the electrical conductor separates the photovoltaically active layer of the first solar cell from the photovoltaically active layer of the second solar cell.

5. The solar module according to claim 1, wherein the lower electrically conductive layer of a first solar cell is separated from the lower electrically conductive layer of an adjoining second solar cell by a first trench and the upper electrically conductive layer of the first solar cell is separated from the upper electrically conductive layer of the adjoining second solar cell by a second trench.

6. The solar module according to claim 5, wherein the first trench is filled with the material of which the adjoining photovoltaically active layer consists.

7. The solar module according to claim 6, wherein a bottom of the second trench is formed by a lower electrically conductive layer.

8. The solar module according to claim 1, wherein a lower electrically conductive layer of a bypass diode is separated from an adjacent lower electrically conductive layers of solar cells electrically connected in parallel by additional trenches.

9. The solar module according to claim 8, wherein a trench separating the lower electrically conductive layer of the bypass diode from an adjacent electrically conductive layer of a solar cell electrically connected in parallel is filled with a material of an adjoining photovoltaically active layer.

10. The solar module according to claim 1, wherein the upper electrically conductive layer of a bypass diode is separated from an adjacent upper electrically conductive layers of solar cells electrically connected in parallel by further trenches.

11. The solar module according to claim 10, wherein a bottom of one of the further trenches separating the upper electrically conductive layer of a bypass diode from an adjacent upper electrically conductive layer of a solar cell electrically connected in parallel is formed in a lower electrically conductive layer between the bypass diode and the solar cell.

12. The solar module according to claim 1, wherein the upper electrically conductive layer of a bypass diode is electrically conductively connected to an adjacent lower electrically conductive layer of a first solar cell electrically connected in parallel by means of a first electrical conductor, and the lower electrically conductive layer of the bypass diode is electrically conductively connected to an adjacent upper electrically conductive layer of a second solar cell electrically connected in parallel by means of a second electrical conductor.

13. The solar module according to claim 12, wherein the second electrical conductor electrically connecting an electrically conductive layer of the bypass diode to an adjacent electrically conductive layer of a solar cell electrically connected in parallel separates the photovoltaically active layer of the bypass diode from the photovoltaically active layer of the solar cell.

14. The solar module according to claim 1, wherein the one or more trenches separating a first bypass diode from an adjoining second bypass diode pass through all layers of the first and second bypass diodes.

15. The solar module according to claim 1, wherein the photovoltaically active layers of the solar cells and of the bypass diodes consist of a pn semiconductor.

16. The solar module according to claim 1, wherein the solar cells and the bypass diodes are arranged in a plane.

17. The solar module according to claim 1, wherein the bypass diodes are shaded.

18. The solar module according to claim 1, wherein a top side of each bypass diode is smaller than a top side of each solar cell.

\* \* \* \* \*